(12) United States Patent
Sato et al.

(10) Patent No.: US 11,563,169 B2
(45) Date of Patent: Jan. 24, 2023

(54) MAGNETIC TUNNEL JUNCTION ELEMENT AND MAGNETIC MEMORY

(71) Applicant: TOHOKU UNIVERSITY, Sendai (JP)

(72) Inventors: Hideo Sato, Sendai (JP); Yoshihisa Horikawa, Sendai (JP); Shunsuke Fukami, Sendai (JP); Shoji Ikeda, Sendai (JP); Fumihiro Matsukura, Sendai (JP); Hideo Ohno, Sendai (JP); Tetsuo Endoh, Sendai (JP); Hiroaki Honjo, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 268 days.

(21) Appl. No.: 15/776,902

(22) PCT Filed: Nov. 18, 2016

(86) PCT No.: PCT/JP2016/084372
§ 371 (c)(1),
(2) Date: Sep. 28, 2018

(87) PCT Pub. No.: WO2017/086481
PCT Pub. Date: May 26, 2017

(65) Prior Publication Data
US 2019/0019944 A1    Jan. 17, 2019

(30) Foreign Application Priority Data
Nov. 18, 2015   (JP) .............................. JP2015-225994

(51) Int. Cl.
*H01L 43/08*   (2006.01)
*H01L 43/10*   (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
CPC .............. G11C 11/1675; G11C 11/161; G11C 11/1695; H01L 27/222; H01L 43/02; H01L 43/08; H01L 43/10; H01L 43/12
(Continued)

(56) References Cited

U.S. PATENT DOCUMENTS 7,696,551 B2    4/2010   Xiao et al.
8,722,543 B2    5/2014   Belen et al.
(Continued)

FOREIGN PATENT DOCUMENTS

JP    2008028362 A    2/2008
JP    2008103728 A    5/2008
(Continued)

OTHER PUBLICATIONS

Int'l. Search Report issued in Int'l. App. No. PCT/JP2016/084372, dated Dec. 27, 2016.
(Continued)

*Primary Examiner* — Galina G Yushina
(74) *Attorney, Agent, or Firm* — Greer, Burns & Crain, Ltd.

(57) ABSTRACT

A magnetic tunnel junction element (10) includes a configuration in which a reference layer (14) that includes a ferromagnetic material, a barrier layer (15) that includes O, a recording layer (16) that includes a ferromagnetic material including Co or Fe, a first protective layer (17) that includes O, and a second protective layer (18) that includes at least one of Pt, Ru, Co, Fe, CoB, FeB, or CoFeB are layered.

11 Claims, 19 Drawing Sheets

(51) Int. Cl.
 *G11C 11/16* (2006.01)
 *H01L 43/02* (2006.01)
(52) U.S. Cl.
 CPC ...... *G11C 11/1675* (2013.01); *G11C 11/1695* (2013.01); *H01L 43/02* (2013.01); *H01L 43/10* (2013.01)
(58) Field of Classification Search
 USPC .................................................. 257/420–426
 See application file for complete search history.

(56) References Cited

U.S. PATENT DOCUMENTS

| | | | |
|---|---|---|---|
| 9,218,864 B1 | 12/2015 | Yi et al. | |
| 9,230,626 B2 | 1/2016 | Buhrman et al. | |
| 9,293,694 B2 | 3/2016 | Yi et al. | |
| 9,337,415 B1* | 5/2016 | Oh | H01L 43/08 |
| 9,478,309 B2 | 10/2016 | Nebashi et al. | |
| 9,666,256 B1 | 5/2017 | Lai et al. | |
| 9,691,458 B2 | 6/2017 | Ralph et al. | |
| 2007/0058301 A1* | 3/2007 | Shimazawa | G11B 5/3929 360/324.1 |
| 2008/0151614 A1 | 6/2008 | Guo | |
| 2010/0200900 A1* | 8/2010 | Iwayama | H01F 10/3254 257/295 |
| 2010/0244897 A1 | 9/2010 | Saito et al. | |
| 2010/0271870 A1 | 10/2010 | Zheng et al. | |
| 2011/0044099 A1 | 2/2011 | Dieny | |
| 2012/0018822 A1 | 1/2012 | Gaudin et al. | |
| 2012/0098077 A1 | 4/2012 | Gaudin et al. | |
| 2012/0267734 A1 | 10/2012 | Sasaki et al. | |
| 2013/0070522 A1* | 3/2013 | Saida | G11C 11/1675 365/173 |
| 2013/0175644 A1* | 7/2013 | Horng | H01L 43/12 257/E29.323 |
| 2014/0010004 A1 | 1/2014 | Suzuki | |
| 2014/0124882 A1 | 5/2014 | Khalili Amiri et al. | |
| 2014/0169088 A1 | 6/2014 | Buhrman et al. | |
| 2014/0286077 A1* | 9/2014 | Hatsuda | G11C 13/004 365/148 |
| 2015/0171315 A1* | 6/2015 | Gan | H01L 29/66984 257/421 |
| 2015/0295166 A1 | 10/2015 | Suzuki | |
| 2015/0348606 A1 | 12/2015 | Buhrman et al. | |
| 2016/0155931 A1* | 6/2016 | Lee | H01L 43/08 257/421 |
| 2016/0247550 A1 | 8/2016 | Fukami et al. | |
| 2016/0315249 A1 | 10/2016 | Kardasz et al. | |
| 2017/0178705 A1 | 6/2017 | Buhrman et al. | |
| 2017/0222135 A1* | 8/2017 | Fukami | H01L 43/08 |

FOREIGN PATENT DOCUMENTS

| | | |
|---|---|---|
| JP | 2012235015 A | 11/2012 |
| JP | 2012238631 A | 12/2012 |
| JP | 2012244031 A | 12/2012 |
| JP | 2013115401 A | 6/2013 |
| JP | 2013541219 A | 11/2013 |
| JP | 2014207469 A | 10/2014 |
| JP | 2015088520 A | 5/2015 |
| WO | 2012056348 A1 | 5/2012 |
| WO | 2012127722 A1 | 9/2012 |
| WO | 2013025994 A2 | 2/2013 |
| WO | 2013069091 A1 | 5/2013 |
| WO | 2015068509 A1 | 5/2015 |

OTHER PUBLICATIONS

Int'l. Search Report issued in Int'l. App. No. PCT/JP2015/071562, dated Sep. 29, 2015.

* cited by examiner

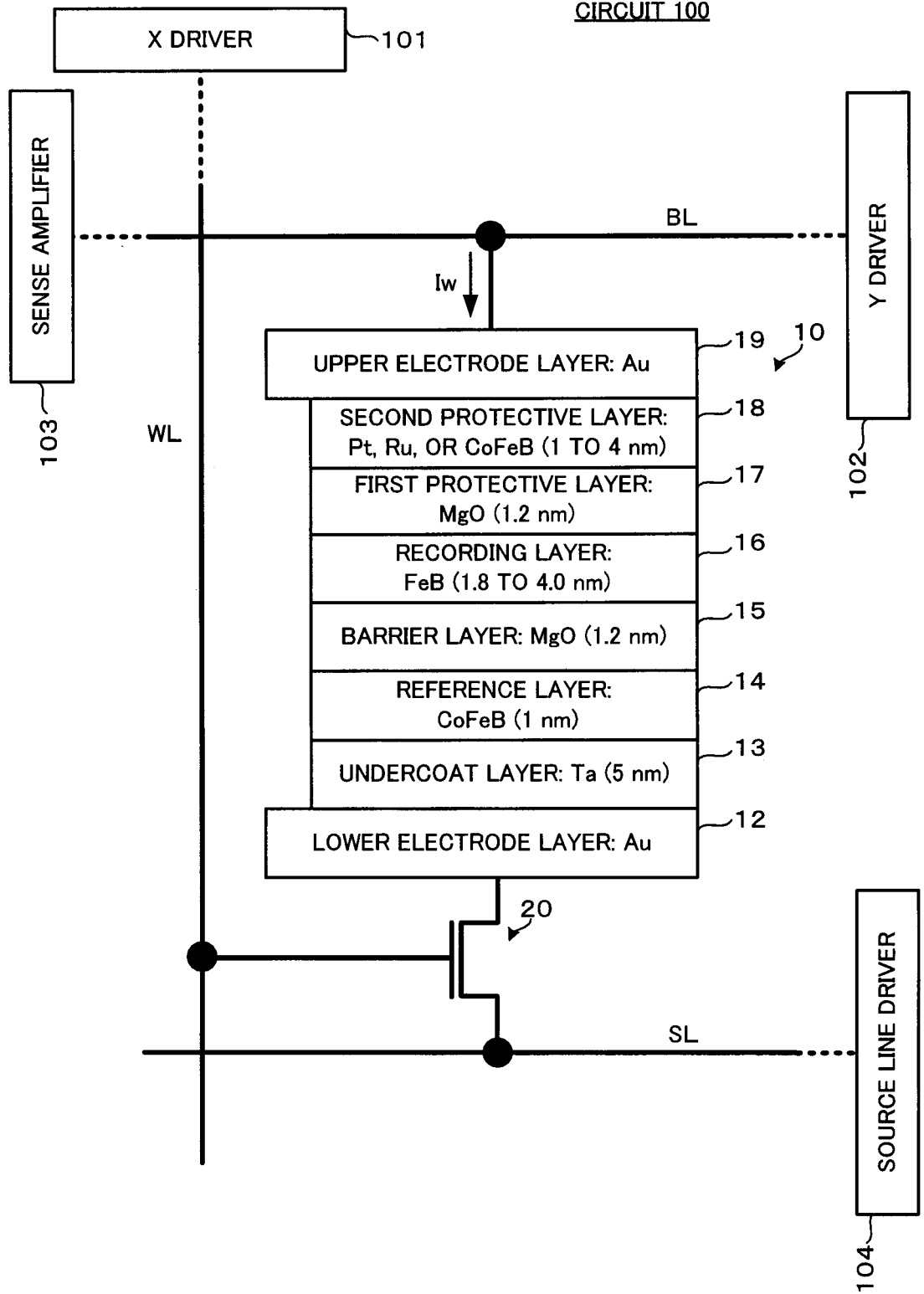

MAGNETIC TUNNEL JUNCTION ELEMENT AND MAGNETIC MEMORY

This is a National Phase Application filed under 35 U.S.C. § 371, of International Application No. PCT/JP2016/084372, filed Nov. 18, 2016, the contents of which are incorporated by reference.

TECHNICAL FIELD

This disclosure relates to a magnetic tunnel junction element and a magnetic memory.

BACKGROUND ART

Patent Literature 1 discloses an MTJ element having a structure (double interface structure) in which a recording layer including CoFeB is interposed between a barrier layer (MgO) and a protective layer (MgO) including oxygen. An MTJ element having a double interface structure is also disclosed in Patent Literature 2 (paragraph 0011, FIG. 1). A protective layer in the MTJ element disclosed in Patent Literature 2 includes a conductive oxide layer. Patent Literature 2 further discloses a configuration in which a metal cap layer 13 is formed on an oxide cap layer 31 (protective layer).

CITATION LIST

Patent Literature

Patent Literature 1: Unexamined Japanese Patent Application Kokai Publication No. 2014-207469
Patent Literature 2: International Publication No. WO 2013-069091

SUMMARY OF INVENTION

Technical Problem

The MTJ elements described in Patent Literature 1 and 2 can exhibit sufficient characteristics in the current technological generation. However, the smaller size of such an MTJ element may prevent sufficient characteristics from being obtained.

This point will be described in more detail. The performance of an MTJ element is represented by a tunnel magnetoresistance ratio TMR, a thermal stability factor $\Delta$, and a threshold current. The tunnel magnetoresistance ratio TMR is expressed by equation: $TMR=(Rap-Rp)/Rp$. Rp represents the resistance value of the current path of the MTJ element in a case in which the magnetizations of a reference layer and a free layer adjacent to a barrier film are arranged in parallel, and Rap represents the resistance value of the current path in a case in which the magnetizations of the reference layer and the free layer adjacent to the barrier film are arranged in anti-parallel. The thermal stability factor $\Delta$ is roughly proportional to $Keff \cdot V/k_BT$. Here, Keff represents an effective magnetic anisotropy energy density, V represents a volume, kB represents a Boltzmann constant, and T represents an absolute temperature. Commonly, a higher tunnel magnetoresistance ratio TMR is preferable, and a higher value obtained by dividing a thermal stability factor $\Delta$ by a threshold current is preferable.

A data retention period of 10 years or more is required for using an MTJ element as a mass storage element. A thermal stability factor $\Delta$ of 80 or more is required for ensuring the data retention period. However, it is not easy to ensure a thermal stability factor $\Delta$ of 80 or more. A relationship between the size (diameter) of the junction surface of magnetic tunnel junction between a ferromagnetic electrode formed of CoFeB and a MgO layer and an interface magnetic anisotropy required for ensuring a thermal stability factor $\Delta$ of 80 in a case in which the junction surface is allowed to be circular is illustrated as an example in FIG. 19.

As illustrated in FIG. 19, the interface magnetic anisotropy required for ensuring a thermal stability factor $\Delta=80$ is increased by reducing the size of the junction surface. Particularly when the size of the junction surface is 30 nm or less, the interface magnetic anisotropy required for ensuring a thermal stability factor $\Delta=80$ is sharply increased. When the size of the junction surface is 20 nm or less, an interface magnetic anisotropy of 2.5 $[mJ/m^2]$ or more is required.

However, it is impossible to obtain such a high interface magnetic anisotropy in the configurations disclosed in Patent Literature 1 and 2.

The present disclosure was made under such actual circumstances with an objective of providing a magnetic tunnel junction element having a higher thermal stability factor and a magnetic memory.

Solution to Problem

In order to achieve the objective, a magnetic tunnel junction element of the present disclosure includes: a reference layer that includes a ferromagnetic material; a barrier layer that includes O; a recording layer that includes a ferromagnetic material including Co or Fe; a first protective layer that includes O; and a second protective layer that includes at least one of Pt, Ru, Co, Fe, CoB, FeB, or CoFeB. The reference layer, the barrier layer, the recording layer, the first protective layer and the second protective layer are layered.

The second protective layer includes a layer including at least one of, for example, Pt or Ru and has a thickness of 0.3 to 3.5 nm.

The second protective layer includes a layer including at least one of, for example, Co, Fe, CoB, FeB, or CoFeB and has a thickness of 0.1 to 3.5 nm.

For example, at least one of a junction surface between the reference layer and the barrier layer, a junction surface between the barrier layer and the recording layer, or a junction surface between the recording layer and the first protective layer is a junction surface of which the area is smaller than the area of a circle having a diameter of 30 nm.

The direction of the magnetization of the recording layer is perpendicular to an interface between the recording layer and the barrier layer or the first protective layer, with which the recording layer comes into contact, for example, due to the magnetic anisotropy of the interface.

The magnetic tunnel junction element may include, on the second protective layer, a third protective layer including Ru, Rh, Pd, Cu, Ir, Au, Ta, Hf, W, Zr, Nb, Mo, Ti, V, Cr, or an alloy thereof.

The second protective layer has a thickness of, for example, 0.6 to 1.5 nm.

The second protective layer desirably has a thickness of 0.6 to 1.0 nm.

The second protective layer is desirably a non-magnetic material.

For example, the second protective layer has magnetism, and the magnetic tunnel junction element may further include: a non-magnetic layer formed on the second protective layer; and a ferromagnetic layer formed on the non-magnetic layer and magnetized in a direction parallel and opposite to the direction of the magnetization of the second protective layer.

The second protective layer has a thickness of, for example, 0.6 to 3.5 nm.

The ferromagnetic layer includes at least one of, for example, Co, Fe, CoB, FeB, CoFeB, a CoPt alloy, a CoPd alloy, an FePt alloy, an FePd alloy, and a ferrimagnetic material.

A magnetic memory according to this disclosure includes:
a storage cell including the magnetic tunnel junction element described above;
a write circuit that selects the storage cell and writes data into the storage cell; and
a read circuit that selects the storage cell and reads data from the storage cell.

Advantageous Effects of Invention

According to the present disclosure, there can be obtained: a magnetic tunnel junction element having high thermal stability factor; and a magnetic memory using the magnetic tunnel junction element.

BRIEF DESCRIPTION OF DRAWINGS

FIG. 5 is a view illustrating the configuration of a magnetic memory circuit including the MTJ element according to Embodiment 1;

DESCRIPTION OF EMBODIMENTS

Figure 1:
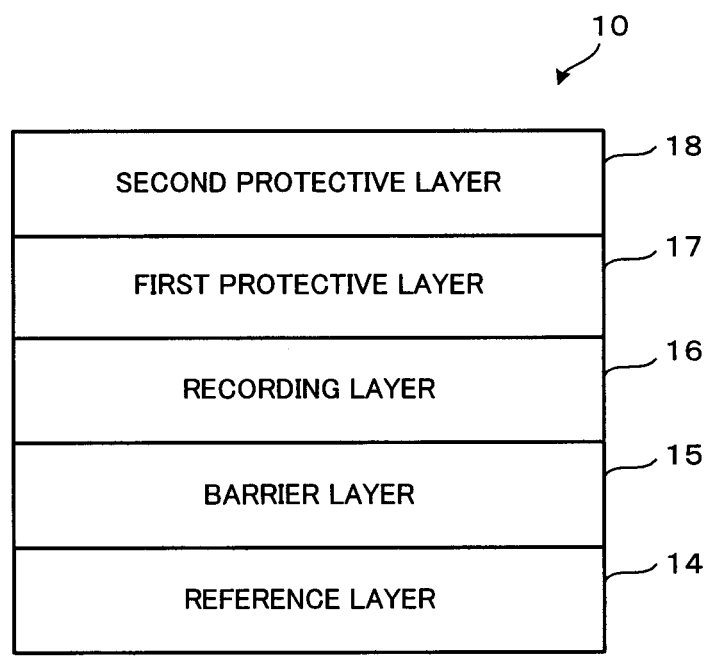
FIG. 1 is a view illustrating the layered structure of a magnetic tunnel junction element (MTJ element) according to Embodiment 1 of the present disclosure.

A magnetic tunnel junction element according to an embodiment of the present disclosure and a magnetic memory using the magnetic tunnel junction element will be described below.

Embodiment 1

A magnetic tunnel junction (MTJ) element 10 according to the present embodiment includes a magnetic tunnel junction exhibiting a high interface magnetic anisotropy. The MTJ element 10 includes a structure in which a reference layer 14, a barrier layer 15, a recording layer 16, a first protective layer 17, and a second protective layer 18 are layered in the order mentioned above, as illustrated in FIG. 1. The second protective layer 18, the first protective layer 17, the recording layer 16, the barrier layer 15, and the reference layer 14 are illustrated in the order mentioned above from the top in FIG. 1 but may be inverted. The same also applies to the other drawings.

The reference layer (fixed layer) 14 includes a CoFeB layer having a thickness of 1.0 nm, and the direction of the magnetization of the reference layer is fixed in one direction perpendicular to an interface.

The barrier layer 15 includes a MgO layer having a thickness of around 1 nm.

The recording layer (free layer) 16 includes an FeB layer having a thickness of 1.8 nm, and the direction of the magnetization of the recording layer is a direction perpendicular to an interface and is changed the direction by spin-injection writing. The thickness of the recording layer 16 is not limited to 1.8 nm but is preferably within 1.8 nm to 4 nm.

The first protective layer 17 (cap layer) includes a MgO layer having a thickness of 1.2 nm.

The second protective layer (cap layer) 18 is formed to have a thickness of 1 nm and includes CoFeB as an amorphous material and Ru and Pt as crystalline materials. The second protective layer 18 is formed by sputtering. The thickness of the second protective layer 18 is not limited to 1 nm but is preferably in a range of 1 nm to 4 nm.

Figure 2:
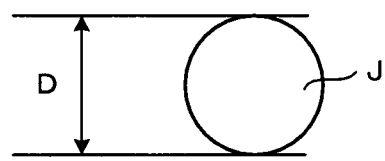
FIG. 2 is a view of the shape of a magnetic tunnel junction surface of the MTJ element according to Embodiment 1.

The interface between the reference layer 14 and the barrier layer 15 and the interface between the barrier layer 15 and the recording layer 16 form a magnetic tunnel junction J. The magnetic tunnel junction J has a roughly circular junction surface as illustrated in FIG. 2, and the roughly circular junction surface preferably has a diameter D of 30 nm or less. The interface between the recording layer 16 and the first protective layer 17 also has a roughly circular junction surface as illustrated in FIG. 2, and the roughly circular junction surface has preferably a diameter D of 30 nm or less.

Alternatively, at least one of the interface between the reference layer 14 and the barrier layer 15, the interface between the barrier layer 15 and the recording layer 16, and the interface between the recording layer 16 and the first protective layer 17 may have a roughly circular junction surface having a diameter D of 30 nm or less. The junction surface needs not be circular. In such a case, the effective area of the junction surface is preferably smaller than the area of a circle having a diameter of 30 nm.

Figure 3:
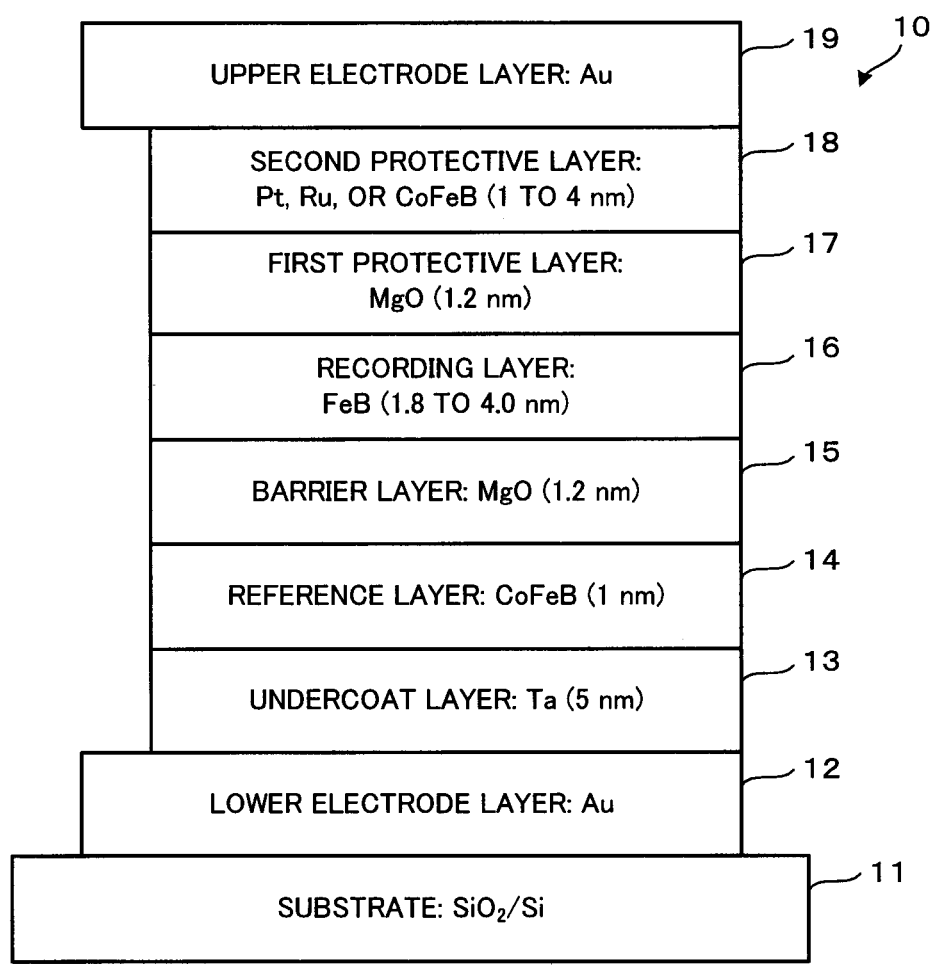
FIG. 3 is a view illustrating an example of the actual element structure of the MTJ element illustrated in FIG. 1.

The actual MTJ element 10 includes a substrate 11, a lower electrode layer 12 formed on the substrate 11, and an undercoat layer 13 formed on the lower electrode 12, as illustrated in FIG. 3. The layers from the reference layer 14 to the second protective layer 18 are formed in turn on the undercoat layer 13. An upper electrode layer 19 is formed on the second protective layer 18.

In FIG. 3, the substrate 11 includes a Si layer and a $SiO_2$ layer formed on the Si layer. When a magnetic memory is produced using the MTJ element 10 according to the present embodiment, the substrate 11 has a structure including a transistor and a multilayered wiring layer.

The lower electrode layer 12 includes a layer with a conductor such as Au.

The undercoat layer 13 includes a Ta layer having a thickness of around 5 nm. The undercoat layer 13 may include a metallic material such as Cu, CuN, Au, Ag, or Ru, an alloy thereof, or the like. The undercoat layer 13 may have a structure in which plural layers of metallic materials are layered, for example, a structure of Ta layer/Ru layer/Ta layer. The undercoat layer 13 is a layer which is an undercoat for forming the layers of the MTJ element 10, and a surface of the undercoat layer 13 is formed to be flat.

The upper electrode layer 19 includes a conductive layer with Au or the like. A material such as Ta, Ti, or a compound of Ta and Ti is also used.

In the MTJ element 10 including the configuration illustrated in FIG. 1 to FIG. 3, a high interface magnetic anisotropy is obtained by allowing the material of the second protective layer 18 to be Pt, Ru, or CoFeB. This point will be specifically described.

Figure 4:
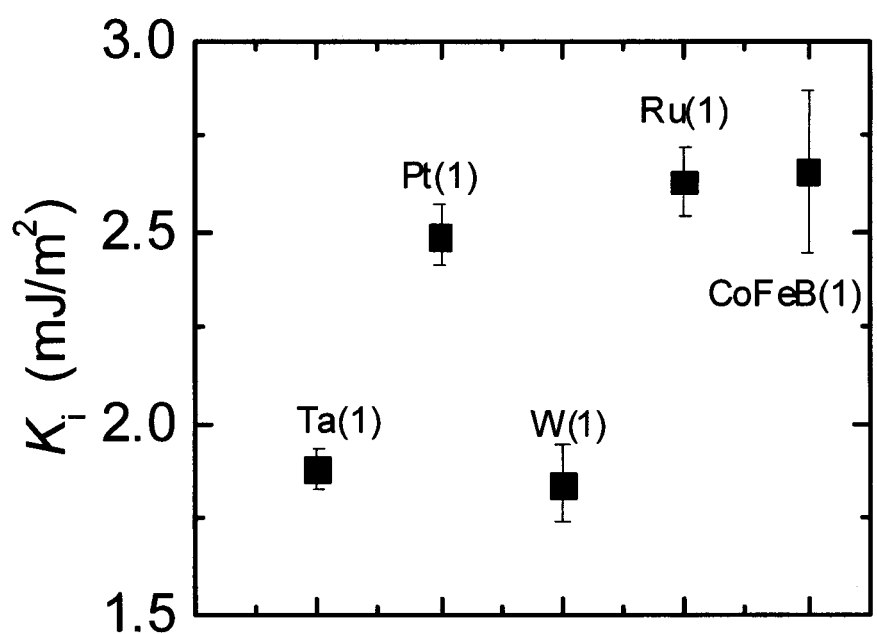
FIG. 4 is a view illustrating a relationship between the kind of a second protective layer illustrated in FIG. 1 and the magnetic anisotropy of a magnetic tunnel junction surface.

FIG. 4 illustrates the strength of the interface magnetic anisotropy of the junction surface J between the barrier layer 15 and the recording layer 16 in the MTJ element 10 in a case in which the second protective layer 18 having a thickness of 1 nm is formed of Ta, W, Pt, Ru, or CoFeB, and the recording layer 16 having a thickness of 1.8 nm to 4 nm is formed of FeB. The second protective layer 18 is formed by, for example, sputtering, and then annealed at a temperature of 300° C.

As illustrated in the figure, the value of the interface magnetic anisotropy of the junction surface J is about 1.8 to 1.9 $[mJ/m^2]$ when the second protective layer 18 is formed of Ta or W. In contrast, the interface magnetic anisotropy of the junction surface J is about 2.5 $[mJ/m^2]$ or more when the second protective layer 18 is formed of Pt, Ru, or CoFeB.

This reveals that the interface magnetic anisotropy of the junction surface J of the MTJ element 10 in a case in which the second protective layer 18 is formed of Pt, Ru, or CoFeB is higher than the value of the interface magnetic anisotropy of the junction surface J of the MTJ element 10 in a case in which the second protective layer 18 is formed of Ta or W.

Figure 19:
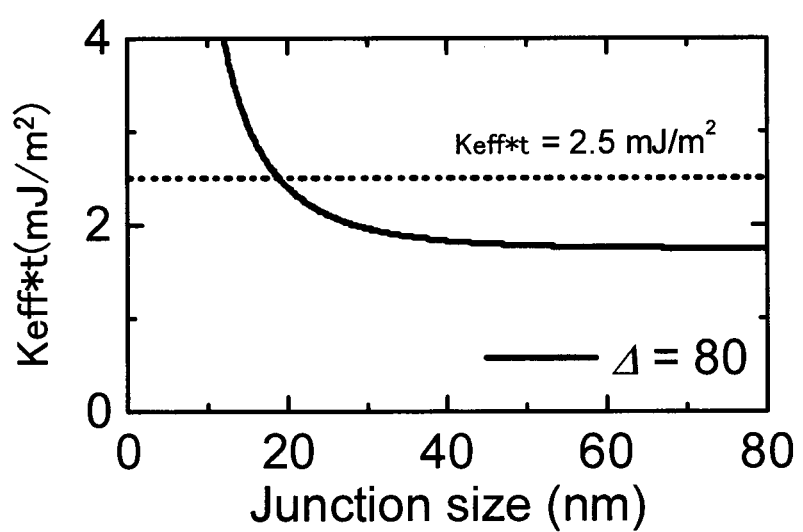
FIG. 19 is a graph illustrating a relationship between the size of magnetic tunnel junction and the magnitude of an interface magnetic anisotropy required for ensuring a thermal stability factor=80.

As described with reference to FIG. 19, the value of an interface magnetic anisotropy that enables a thermal stability factor $\Delta=80$ to be ensured is increased with decreasing the diameter D of the tunnel junction surface J. Particularly when the diameter D is less than 30 nm, the value is sharply increased. When the diameter D of the magnetic tunnel junction surface J is 40 nm, a sufficient thermal stability factor $\Delta$ can be obtained even in the case of using Ta or W in the second protective layer 18. However, when the magnetic tunnel junction surface J becomes small, for example, the diameter D of the magnetic tunnel junction surface J is 30 nm or 20 nm, an insufficient thermal stability factor $\Delta$ is caused by using Ta or W in the second protective layer 18.

In contrast, when Pt, Ru, or CoFeB is used in the second protective layer 18, an interface magnetic anisotropy of 2.5 $[mJ/m^2]$ or more can be obtained. Accordingly, a sufficient thermal stability factor $\Delta$ can be obtained even in the magnetic tunnel junction surface J having a diameter D of around 20 nm. As described above, in the MTJ element 10 of the present embodiment, Pt, Ru, or CoFeB is used in the second protective layer 18, an interface magnetic anisotropy of 2.5 $[mJ/m^2]$ or more can be obtained, and a sufficient thermal stability factor $\Delta$ can be obtained even in the magnetic tunnel junction surface J having a diameter D of 30 nm or less, for example, a diameter D=around 20 nm.

As a result, the performance of an integrated circuit or a memory in which a magnetic tunnel junction is used can also be improved.

The reason why an interface magnetic anisotropy becomes low in the case of using a material such as Ta or W in the second protective layer 18 is because the second protective layer 18 damages the MgO layer included in the first protective layer 17 underneath the second protective layer 18. The physical cause of the damage to the MgO layer is related to an affinity between a substance included in the second protective layer and oxygen. Ta or W has a high affinity for oxygen (has a low energy for generating an oxide) and forms an oxide that is stable at room temperature. Accordingly, when the second protective layer 18 is formed of Ta or W by sputtering, deposited Ta or W reacts with oxygen in MgO included in the first protective layer 17, thereby damaging the MgO layer. In contrast, Pt, Ru, and CoFeB have a low affinity for oxygen. Therefore, deposited Pt, Ru, or CoFeB is capable of forming a thin film without damaging MgO included in the first protective layer 17 in the process of forming the second protective layer 18.

A magnetic memory circuit 100 in which the MTJ element 10 having the configuration described above is used as a memory cell will now be described with reference to FIG. 5.

As illustrated in FIG. 5, the magnetic memory circuit 100 has a structure in which the MTJ element 10 and a selection transistor 20 are formed in a memory cell corresponding to one bit, and such memory cells are arrayed in a matrix form.

The source electrode of the selection transistor 20 to a source line SL, the drain electrode of the selection transistor 20 to the lower electrode layer 12 of the MTJ element 10, and gate electrode of the selection transistor 20 to and a word line WL are electrically connected to respectively. The upper electrode layer 19 of the MTJ element 10 is connected to a bit line BL.

The word line WL is connected to an X driver (word line driver) 101, the bit line BL is connected to a Y driver (bit line driver) 102 and a sense amplifier 103, and the source line SL is connected to a source line driver 104.

The word line WL, the bit line BL, the source line SL, the X driver 101, the Y driver 102, and the source line driver 104 function as a write circuit that selects a memory cell (MTJ element 10) and writes data into the memory cell, while the word line WL, the bit line BL, the source line SL, the X driver 101, the sense amplifier 103, and the source line driver 104 function as a read circuit that selects a memory cell and reads stored data from the memory cell.

Figure 6A:
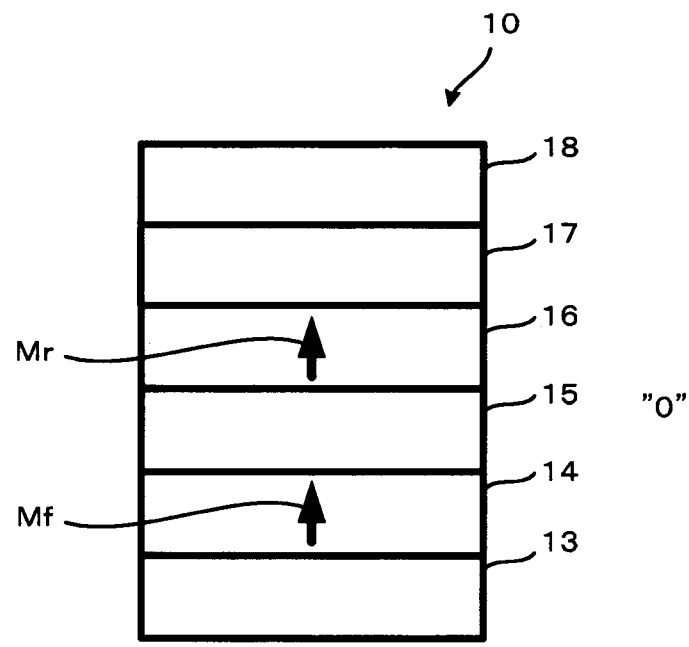
FIG. 6A and FIG. 6B are views for explaining the parallel state (low-resistance state) and anti-parallel state (high-resistance state) of the magnetization of a recording layer and a reference layer adjacent to a barrier layer in an MTJ element.
Figure 6B:
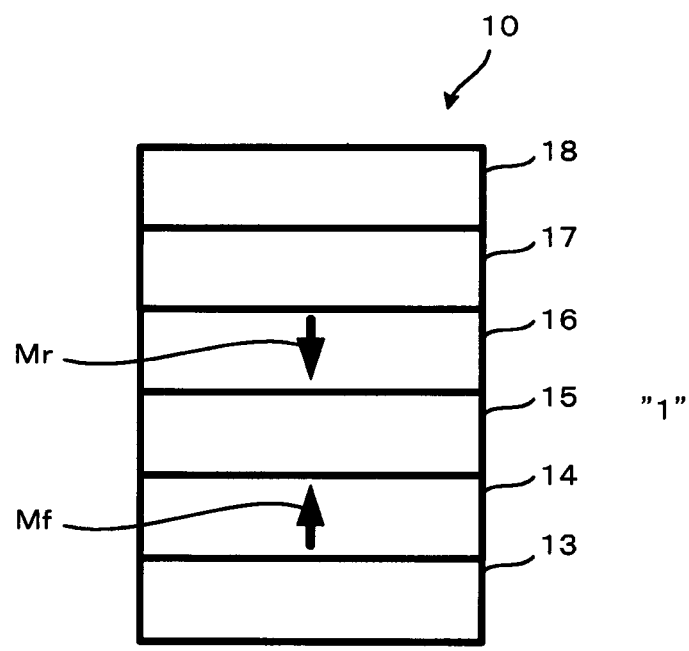

As illustrated in FIG. 6A, a resistance between the lower electrode layer 12 and the upper electrode layer 19 is low when the direction of the magnetization Mf of the reference layer 14 and the direction of the magnetization Mr of the recording layer 16 are parallel to each other and the same direction (P state). In such a case, the resistance of the MTJ element 10 is low. In contrast, the resistance of the MTJ element 10 is high when the directions are anti-parallel (parallel and opposite directions: AP state) as illustrated in FIG. 6B. The low and high values of the resistances are allowed to correspond to "0" and "1" of bit information. In this embodiment, the low resistance is assigned with "0", and the high resistance is assigned with "1".

When information is written into the MTJ element 10, the X driver 101 controls the voltage of the word line WL connected to the MTJ element 10 for writing, thereby turning on the corresponding selection transistor 20. Subsequently, the Y driver 102 and the source line driver 104 adjust a voltage applied between the bit line BL and the source line SL that are connected to the MTJ element 10 for writing, thereby controlling the direction and magnitude of a write current Iw passing through the MTJ element 10 and writing desired data by spin injection magnetization inversion.

When the write current Iw passes from the recording layer 16 to the reference layer 14, the direction of the magnetization Mr of the recording layer 16 is the same as the direction of the magnetization Mf of the reference layer 14, and "0" is written. When the write current Iw passes from reference layer 14 to the recording layer 16, the direction of the magnetization Mr of the recording layer 16 is opposite to the direction of the magnetization Mf of the reference layer 14, and "1" is written.

In the case of reading, the X driver 101 applies the selected voltage to the word line WL and turns on the selection transistor 20 connected to the MTJ element 10 for reading, and the Y driver 102 and the source line driver 104 applies a read voltage between the bit line BL and the source line SL that are connected to the MTJ element 10 for reading. A current corresponding to the resistance value of the MTJ element 10 passes through to the MTJ element 10 by applying the read voltage. The sense amplifier 103 converts the current into a voltage, thereby reading recorded data.

As described above, the MTJ element 10 according to the present embodiment includes: the barrier layer 15 between the reference layer 14 and the recording layer 16; the first protective layer 17 on the recording layer 16; and further the second protective layer 18 on the first protective layer 17. Because the second protective layer 18 does not damage the first protective layer 17, a high magnetic anisotropy can be obtained, and a high thermal stability factor can be obtained.

This disclosure is not limited to the above-described embodiment, and various modifications and applications are possible.

The CoFeB layer of 1.0 nm is used as the reference layer 14 and has an optional thickness. However, the thickness is set to 5 nm, desirably 3 nm or less, still more desirably 1.6 nm or less in order to use perpendicular magnetization caused by interface magnetic anisotropy. As a result, the magnetization of the reference layer 14 is composed principally of the perpendicular magnetization caused by the interface magnetic anisotropy.

The material of the reference layer 14 may include Co or Fe and does not necessarily include B. Further, a conventionally known perpendicular magnetic anisotropy material such as FePt or TbTeCo is also acceptable.

The reference layer 14 is not necessarily a single layered but may be a layered film. For example, a layered film of a Co film and a Pt film, a layered film of a Ni film and a Co film, a multilayer film thereof, a synthetic ferrimagnetic structure, or the like can be used as the reference layer 14.

The MgO layer of 1.2 nm is used as the barrier layer 15 and desirably has a thickness of 10 nm or less, and particularly 5 nm or less. The material of the layer is not limited to MgO but may be another material such as $Al_2O_3$, $SiO_2$, or MgZnO, which includes oxygen and generates a magnetic tunnel junction.

The FeB layer of 1.8 to 4.0 nm is used as the recording layer 16 and has an optional thickness. However, the thickness is set to 5 nm, desirably 3 nm or less, and still more desirably 1.6 nm or less in order to use perpendicular magnetization caused by interface magnetic anisotropy. As a result, the magnetization of the recording layer 16 is composed principally of the perpendicular magnetization caused by the interface magnetic anisotropy.

The material of the recording layer 16 is not limited to FeB but may include at least one of Co, Fe, CoB, FeB, or CoFeB. The material may further include a slight amount of another element. The thickness of the element is also optional.

Further, CoFeBM (where M includes at least one of Ni, Zr, Hf, Ta, Mo, Nb, Pt, Cr, Si, or V) and/or the like may be used in the material of the recording layer 16.

The recording layer 16 is not necessarily a single layer, but a layered film can be used as the recording layer 16. For example, a layered film of a layer including Fe and a layer including FeB or CoB can be used as the recording layer 16. In such a case, it is desirable to arrange the film so that MgO included in the adjacent barrier layer 15 or first protective layer 17 and the layer including B (such as FeB or CoB) are prevented from being adjacent to each other.

For example, it is desirable to adopt an arrangement configuration of a MgO layer (15 or 17), an Fe layer, a CoFeB layer, and a MgO layer (17 or 15), an arrangement configuration of a MgO layer (15), an Fe layer, a CoFeB layer, an Fe layer, and a MgO layer (17), or the like. This is because it is desirable to prevent B from existing in an interface with MgO as much as possible in order to obtain a high interface magnetic anisotropy.

The MgO layer of 1.2 nm is used as the first protective layer 17 and has a thickness of 5.0 nm or less, and desirably 3.0 nm or less. The material of the first protective layer 17 may include oxygen even if being other than MgO. An insulator such as $Al_2O_3$, $SiO_2$, MgZnO, or $Ta_2O_5$ may be used as the material.

A conductive oxide such as $RuO_2$, $VO_2$, $TiO$, $Ti_2O_3$, $ZnO$, or $TaO_2$ may also be used as the material of the first protective layer 17. The conductive oxide included in the first protective layer 17 may include, for example, a rutile-$MoO_2$-type oxide such as $RuO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$, or $Ti_3O_5$. Alternatively, the conductive oxide included in the first protective layer 17 may include a NaCl-type oxide such as TiO, VO, NbO, LaO, NdO, SmO, EuO, SrO, BaO, or NiO.

The conductive oxide film included in the first protective layer 17 may include a spinel-type oxide such as $LiTi_2O_4$, $LiV_2O_4$, or $Fe_3O_4$. Alternatively, the conductive oxide film included in the first protective layer 17 may include a perovskite-$ReO_3$-type oxide such as $ReO_3$, $CaCrO_3$, $SrCrO_3$, $BaMoO_3$, $SrMoO_3$, $CaMoO_3$, $LaCuO_3$, $CaRuO_3$, $SrVO_3$, or $BaTiO_3$.

The conductive oxide layer included in the first protective layer 17 may include a corundum-type oxide such as $Ti_2O_3$, $V_2O_3$, or $Rh_2O_3$. Alternatively, the conductive oxide layer included in the first protective layer 17 may include an oxide semiconductor which is ZnO, $TiO_2$, $SnO_2$, $Cu_2O$, $Ag_2O$, $In_2O_3$, or $WO_3$.

In the recording layer 16, a film including oxygen can be selected as appropriate so that an interface magnetic anisotropy is generated in the interface between the recording layer 16 and the first protective layer 17.

The film thickness of the first protective layer 17 is desirably formed to be equal to or less than the film thickness of the barrier layer 15.

The Pt, Ru, or CoFeB layer of 1.0 nm is used as the second protective layer 18 and has an optional thickness. However, when the thickness is too large, it is difficult to process a magnetic tunnel junction. In contrast, when the thickness is too small, it is impossible to exhibit the effect of the layer. Therefore, in the case of Pt or Ru, it is desirable to set the thickness of the second protective layer 18 to 3.5 nm or less, preferably 0.3 to 3.0 nm, and still more preferably 0.5 to 2.0 nm. In the case of CoFeB, it is desirable to set the thickness of the second protective layer 18 to 3.5 nm or less, preferably 0.1 to 3.0 nm, and still more preferably 0.1 to 1.0 nm.

The second protective layer 18 is not necessarily a single layer but may have a layered structure. For example, the layer may have a layered structure of CoFeB, Pt, and Ru, a structure in which Pt and Ru are alternately layered, or the like.

The second protective layer 18 may be a layer composed principally of Co, Fe, CoB, or FeB, in addition to the Pt, Ru, or CoFeB layer. This is because similarly in the case of Pt and the like, such materials hardly damage MgO included in the adjacently arranged first protective layer 17. In the case of the layer including Co, Fe, CoB, or FeB, it is also desirable to set the thickness of the second protective layer 18 to 3.5 nm or less, preferably 0.1 to 3.0 nm, and still more preferably 0.1 to 1.0 nm, similarly in the case of the layer including CoFeB.

The layer of Fe, CoFeB, CoB, FeB, or the like in the second protective layer 18 functions not as a magnetic layer but as a protective layer for the adjacent first protective layer. Accordingly, it is desirable to form the second protective layer 18 to have a film thickness and the like adjusted so as not to affect the value Ki of the interface magnetic anisotropy. Therefore, it is desirable to form the second protective layer 18 to be thinner than, for example, the recording layer 16.

The substrate 11 is allowed to be the layered body of the Si layer and the $SiO_2$ layer, and the material and thickness of the substrate are optional. Examples of the materials of the lower electrode layer 12 and the upper electrode layer 19 include Au, and other optional conductors such as Al can be used as the materials.

Figure 7:
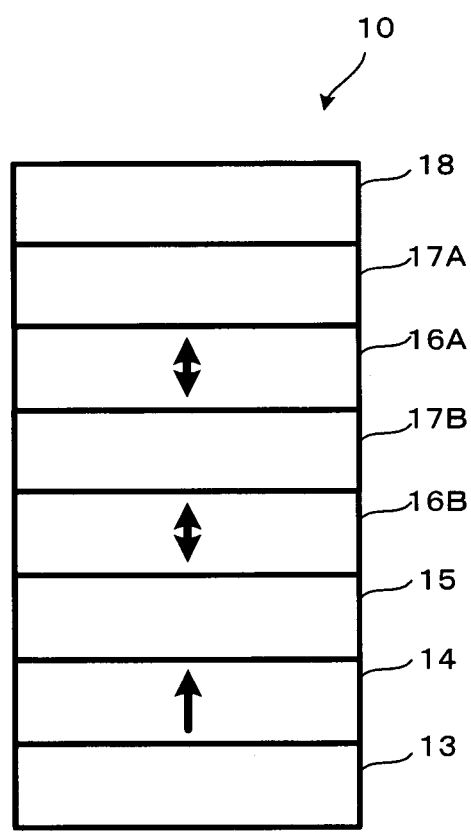
FIG. 7 is a view illustrating an alternative example of the MTJ element illustrated in FIG. 1.

In the embodiment described above, the MTJ element 10 including the reference layer 14 and the recording layer 16 that include the ferromagnetic layers is described as an example. Each ferromagnetic layer may include plural layers. For example, the recording layer 16 in FIG. 1 may be allowed to have a two-layer structure of recording layers 16A and 16B, and a thin non-magnetic coupling layer 17B, for example, a Ta layer of around 0.1 to 1.0 nm may be arranged between the layers, as illustrated in FIG. 7. Examples of the material of the non-magnetic coupling layer 17B include W, Hf, Zr, Nb, Mo, Ti, Mg, MgO, or the like, as well as Ta. Reference character 17A in FIG. 7 denotes a first protective layer.

Figure 8:
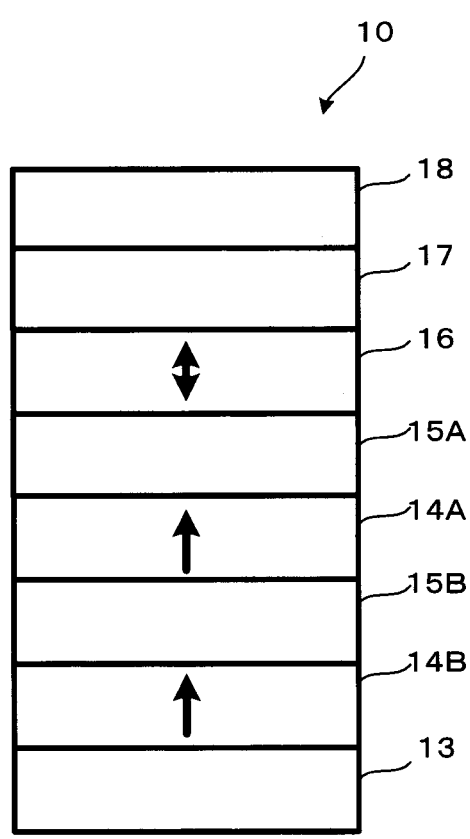
FIG. 8 is a view illustrating an alternative example of the MTJ element illustrated in FIG. 1.
Figure 9:
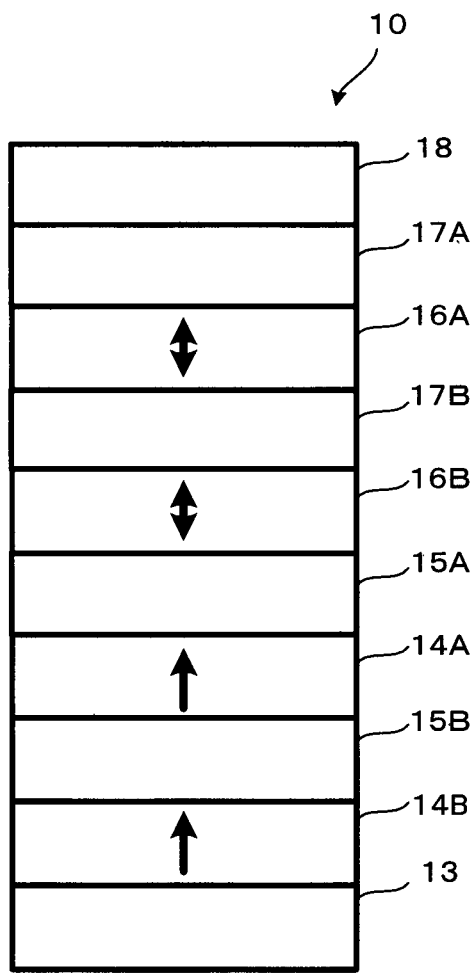
FIG. 9 is a view illustrating an alternative example of the MTJ element illustrated in FIG. 1.

The reference layer 14 in FIG. 1 may be allowed to have a two-layer structure of reference layers 14A and 14B, and a thin non-magnetic coupling layer 15B, for example, a Ta layer of around 0.1 to 1.0 nm may be arranged between the layers as illustrated in FIG. 8. Examples of the material of the non-magnetic coupling layer 15B include W, Hf, Zr, Nb, Mo, Ti, Mg, MgO, or the like, as well as Ta. Reference character 15A in FIG. 8 denotes a barrier layer. A configuration in which non-magnetic coupling layers 17B, 15B are used in both of recording layers (16A, 16B) and reference layers (14A, 14B) as illustrated in FIG. 9 is also acceptable.

Figure 10:
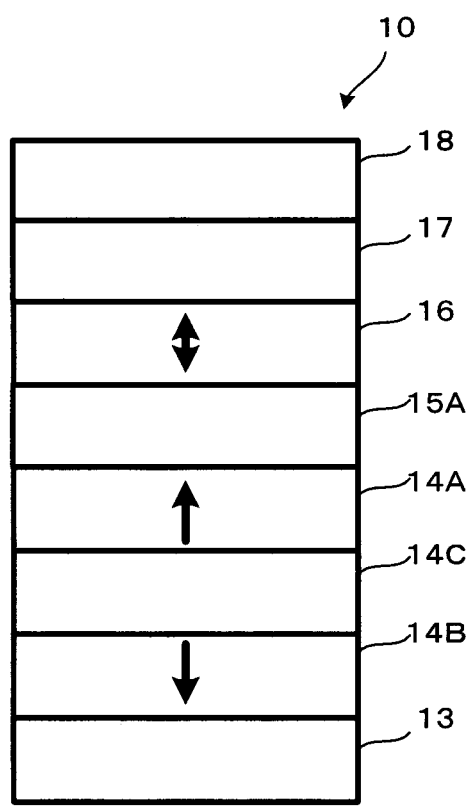
FIG. 10 is a view illustrating an alternative example of the MTJ element illustrated in FIG. 1.

A synthetic ferrimagnetic structure can be used in the reference layer 14 as described above, and an example of the synthetic ferrimagnetic structure is illustrated in FIG. 10. In the example illustrated in FIG. 10, the reference layer 14 has a layered structure in which a reference layer 14A, a coupling layer 14C, and a reference layer 14B are layered. The reference layers 14A and 14B include ferromagnetic layers. The configuration other than the reference layer 14 is the same as that in FIG. 8.

The reference layers 14A and 14B are antiferromagnetically coupled by the coupling layer 14C. For example, Ru can be used in the coupling layer 14C. By using the synthetic ferrimagnetic structure, a magnetic field applied from the reference layer 14 to the recording layer 16 can be reduced, and consequently, asymmetry between thermal stabilities in a "0" state and a "1" state can be reduced.

In the examples of the multilayer structures described above, the examples in which the reference layer and the recording layer are allowed to have the two-layer structures are described. However, such a structure may be a structure including three or more layers.

The shape of the magnetic tunnel junction J illustrated in FIG. 2 is not limited to a circular shape. The shape may be an oval shape, a rectangular shape, or the like. The diameter D of a circular magnetic tunnel junction J having an equal effective area may be adopted as the size of a magnetic tunnel junction in such a case.

Figure 11:
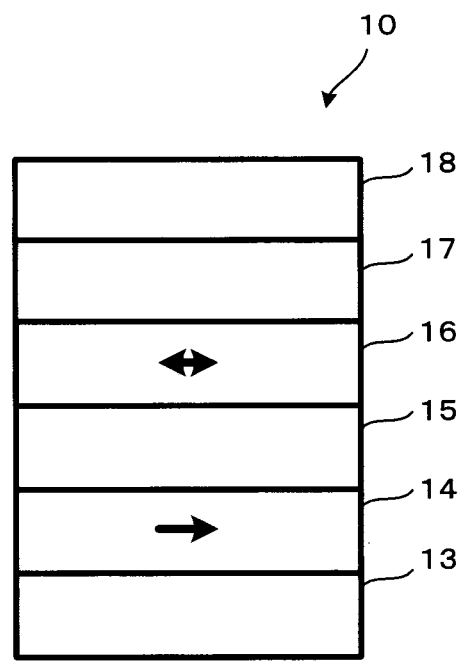
FIG. 11 is a view illustrating an alternative example of the MTJ element illustrated in FIG. 1.

In the above description, the perpendicular magnetization MTJ element has been described. The present disclosure can also be applied to such an in-plane magnetization MTJ element as described in FIG. 11.

In the case of the in-plane magnetization, the application of a second protective layer including Pt, Ru, CoFeB, or the like to an MTJ element results in an increase in a perpendicular magnetic anisotropy component caused by an interface magnetic anisotropy, thereby enabling promotion of tilt of the magnetization of a recording layer in a direction perpendicular to a plane in spin injection magnetization inversion. Accordingly, the efficiency of the spin injection magnetization inversion of the in-plane magnetization MTJ element can be enhanced.

The protective layer that enhances thermal stability factor when MTJ in the present disclosure is allowed to be fine is first found in an MTJ element based on the STT magnetization inversion. However, such a protective film technology is also effective when a domain wall displacement element, an element that modulates a magnetic anisotropy caused by electric field inducement, an element using spin-orbital torque, or the like is allowed to be fine.

Embodiment 2

As described in paragraph 0068, the second protective layer 18 functions not as a magnetic layer but as a protective layer for protecting the adjacent first protective layer 17. The second protective layer 18 is desirably prevented from affecting the value of an interface magnetic anisotropy, that is, is desirably a non-magnetic material.

However, when the second protective layer 18 is formed of CoFeB (Co, Fe, CoB, FeB, or the like), CoFeB is non-magnetic in the case of a small film thickness whereas CoFeB has magnetization in the case of a large film thickness. Therefore, it is difficult to maintain the second protective layer 18 to be non-magnetic in the case of a large film thickness. For maintaining the second protective layer 18 formed of CoFeB to be a non-magnetic layer, it is effective to arrange a third protective layer including Ru or the like on the second protective layer 18 as described in paragraph 0066. An MTJ element 10a having a configuration in which a third protective layer 181 of Ru is arranged on a second protective layer 18 will be described below.

Figure 12:
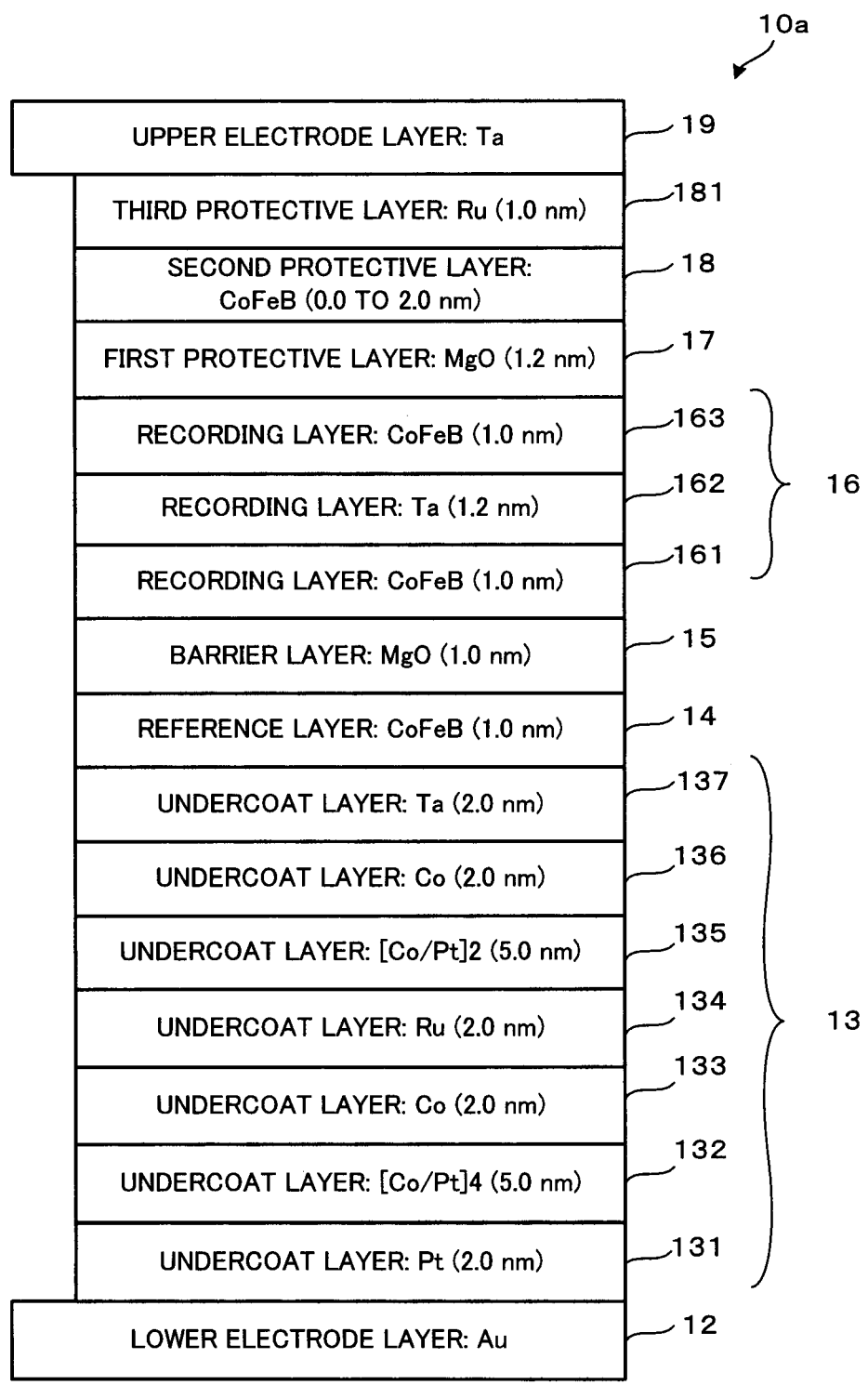
FIG. 12 is a view illustrating the structure of an MTJ element according to Embodiment 2 of the present disclosure.

The MTJ element 10a includes the third protective layer 181 including Ru of around 1 nm on the second protective layer 18 including CoFeB, as illustrated in FIG. 12.

According to such a configuration, Ru atoms in the third protective layer 181 and atoms in the second protective layer 18 are mutually diffused. Therefore, there is a characteristic in that the second protective layer 18 hardly becomes a magnetic layer, that is, easily becomes a non-magnetic layer, in comparison with the case of the single second protective layer 18. The third protective layer 181 prevents O from being desorbed from MgO included in a first protective layer 17 and further prevents the material of an upper layer from being diffused into the first protective layer 17, thereby enabling the magnetic properties of the MTJ element 10a to be prevented from degrading.

Figure 13:
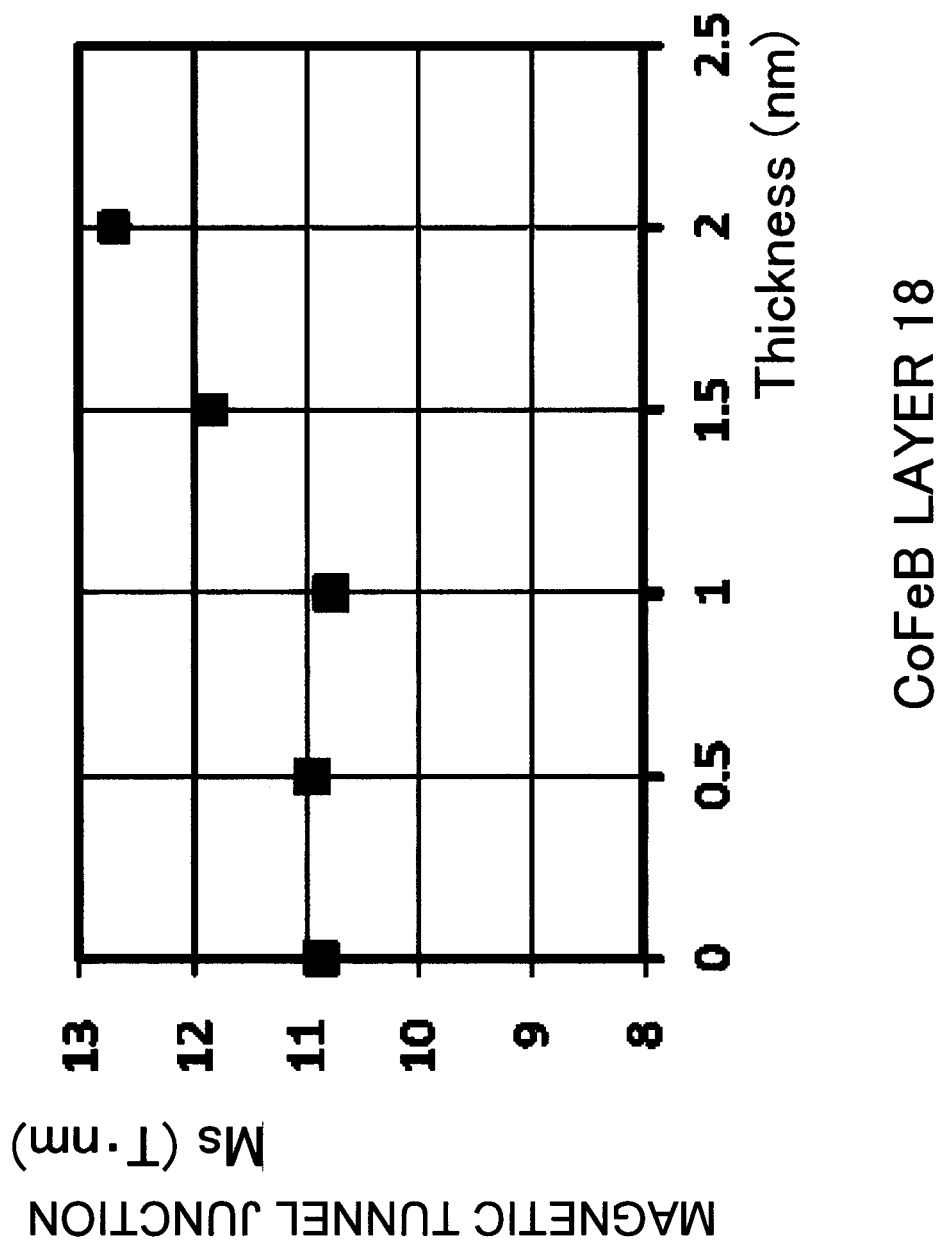
FIG. 13 is a view illustrating a relationship between the film thickness of a second protective layer in the MTJ element illustrated in FIG. 12 and the magnitude of the saturation magnetization of the MTJ element.

A relationship between the film thickness (0.5 nm to 2.0 nm) of the second protective layer 18 of the MTJ element 10a having the configuration illustrated in FIG. 12 and the magnitude of the saturation magnetization Ms of the MTJ element 10a is illustrated in FIG. 13. The abscissa axis of FIG. 13 indicates the thickness of the second protective layer 18 while the ordinate axis of FIG. 13 indicates the magnitude [T·nm] of the saturation magnetization Ms of the MTJ element 10a.

As illustrated in FIG. 13, the saturation magnetization Ms of the MTJ element 10a in which the thickness of the second protective layer 18 is zero (that is, in a case in which the second protective layer 18 does not exist) is around 10.9 [T·nm], and the magnitude of the saturation magnetization Ms is roughly similar even in a case in which the thickness of the second protective layer 18 is 0.5 or 1.0 nm. In contrast, the magnitude of the saturation magnetization Ms is increased with increasing the film thickness in a case in which the thickness of the second protective layer 18 is 1.5 nm or 2.0 nm. In other words, the second protective layer 18 has magnetism when having a thickness of 1.5 nm or more.

Next, the magnetization curves of recording layers 16 and reference layers 14 in a case in which a magnetic field is applied to five MTJ elements 10a including second protective layers 18 having different thicknesses so as to be perpendicular to a film surface of each layer are illustrated in FIG. 14 and FIG. 15.

Figure 14A:
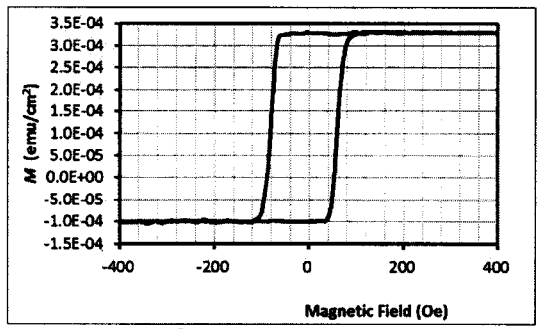
FIG. 14A to FIG. 14E are views illustrating a relationship between the strength of a magnetic field and the magnitude of the magnetization of a recording layer in the case of applying the magnetic field perpendicularly to the layer surfaces of the MTJ element illustrated in FIG. 12, on the basis of each film thickness of a second protective layer.
Figure 14B:
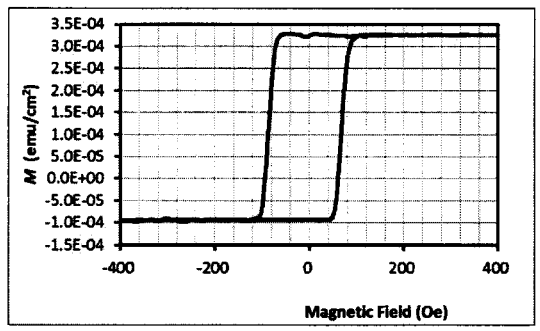
Figure 14C:
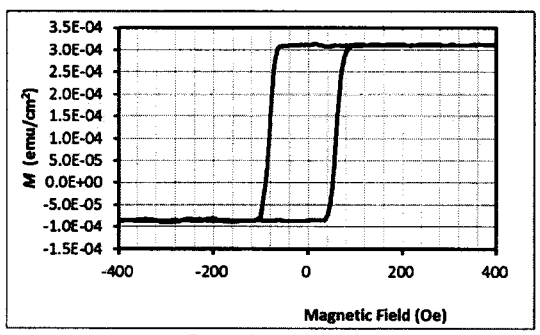
Figure 14D:
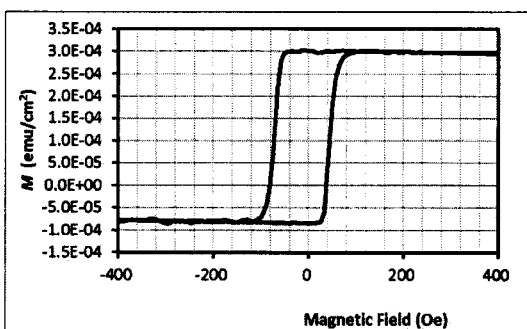
Figure 14E:
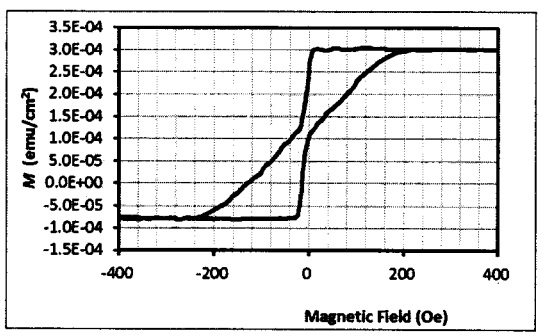
Figure 15A:
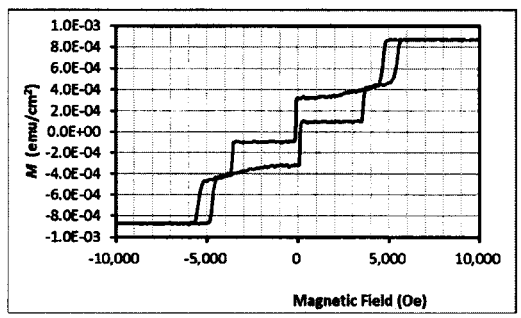
FIG. 15A to FIG. 15E are views illustrating a relationship between the strength of a magnetic field and the magnitude of the magnetization of an MTJ element in the case of applying the magnetic field perpendicularly to the layer surfaces of the MTJ element illustrated in FIG. 12, on the basis of each film thickness of a second protective layer.
Figure 15B:
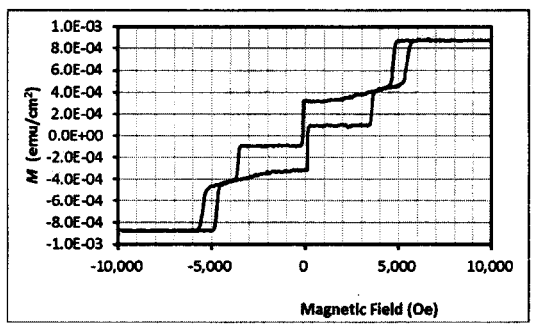
Figure 15C:
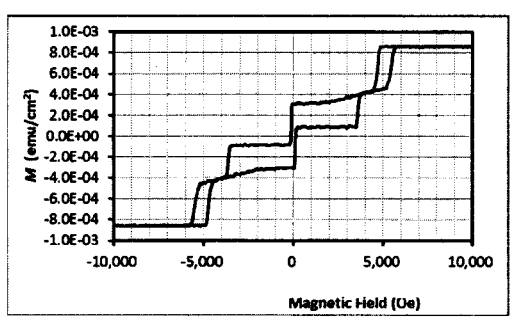
Figure 15D:
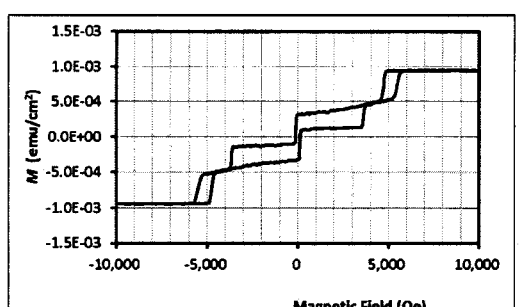
Figure 15E:
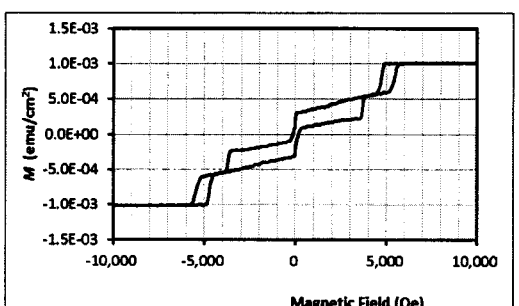

FIGS. 14A to 14E illustrate the magnetization curves of the recording layers 16 in the case of changing an external magnetic field in a range of −400 [Oe] to +400 [Oe]. The abscissa axis of each figure indicates the strength [Oe] of an external magnetic field while the ordinate axis of each figure indicates the magnitude [emu/cm$^2$] of magnetization. As illustrated in FIGS. 14A to 14D, when the thicknesses of the second protective layers 18 are in a range of 0.0 to 1.5 nm, the magnetization curves exhibit favorable rectangular shapes. In contrast, as illustrated in FIG. 14E, when the thickness of the second protective layer 18 is 2.0 nm, the rectangular shape of the magnetization curve is deteriorated. This shows that the perpendicular magnetic anisotropy of the MTJ element 10a is mingled with a magnetic anisotropic component in a plane of the second protective layer 18.

FIGS. 15A to 15E illustrate the magnetization curves of the reference layers 14 in the case of changing an external magnetic field in a range of −10,000 [Oe] to +10,000 [Oe]. The abscissa axis of each figure indicates the strength [Oe] of an external magnetic field while the ordinate axis of each figure indicates the magnitude [emu/cm$^2$] of magnetization. As illustrated in the figures, regions in which magnetization is not changed (plateau regions) exist in the vicinity of an external magnetic field of 0 [Oe] in a case in which the thicknesses of the second protective layers 18 are 1.5 nm or less. In contrast, no plateau region exists in the vicinity of an external magnetic field of 0 [Oe] in a case in which the thickness of the second protective layer 18 is 2.0 nm. This shows that the perpendicular magnetic anisotropy is mingled with a magnetic anisotropic component in a plane.

As described above, such a second protective layer 18 (CoFeB or the like) has a thickness of 0 to 1.5 nm and is non-magnetic, and such an MTJ element 10a exhibits a perpendicular magnetic anisotropy. When the second protective layer 18 has a thickness of 1.5 nm, the second protective layer 18 has magnetism, but the MTJ element 10a still exhibits a perpendicular magnetic anisotropy as illustrated in FIG. 14 and FIG. 15. When the second protective layer 18 has a thickness of more than 2.0 nm, the second protective layer 18 becomes an in-plane magnetic film, and it is impossible to obtain any perpendicular magnetic anisotropy in the MTJ element 10a. When the second protective layer 18 becomes the in-plane magnetic film, a magnetostatic interaction allows a large in-plane magnetic field to be applied to the recording layer 16 and the reference layer 14 which equivalently have perpendicular magnetization-easy axes. The in-plane magnetic field results in the deterioration of the thermal stability factor Δ of the recording layer 16. Thus, it is desirable to set the thickness of the second protective layer 18 to 1.5 nm or less so that the MTJ element 10a has a perpendicular magnetic anisotropy.

In a case in which the third protective layer 181 does not exist, the second protective layer 18 becomes a magnetic film when having a thickness of around 0.6 nm or more. One of the reasons why the second protective layer 18 of the present embodiment becomes non-magnetic even when being 0.6 nm to 1.5 nm is considered to be because Ru in the upper layer is diffused into the second protective layer 18. Therefore, the selection of the material of the third protective layer 181 is important, and it is desirable to select a material that allows the second protective layer 18 to be maintained to be non-magnetic.

For obtaining a large perpendicular magnetization anisotropy in the reference layer 14 and the recording layer 16, it is necessary that the oxygen composition of the first protective layer 17 is close to stoichiometry. When oxygen is removed from the first protective layer 17, it is difficult to ensure perpendicular magnetization. From this viewpoint, the second protective layer 18 is desirably thicker. Thus, the second protective layer 18 is desirably thick as long as non-magnetism is maintained. The second protective layer 18 desirably has a thickness of 0.6 to 1.5 nm, and more desirably 0.6 to 1.0 nm.

The material of the third protective layer 181 is not limited to Ru. Ru, Rh, Pd, Cu, Ir, Au, or an alloy thereof as a noble metal material or Ta, Hf, W, Zr, Nb, Mo, Ti, V, Cr, or an alloy thereof as a base metal material can be used as the material of the third protective layer 181. It is desirable to use a noble metal material from the viewpoint of preventing oxygen from desorbing from the MgO layer.

Figure 16:
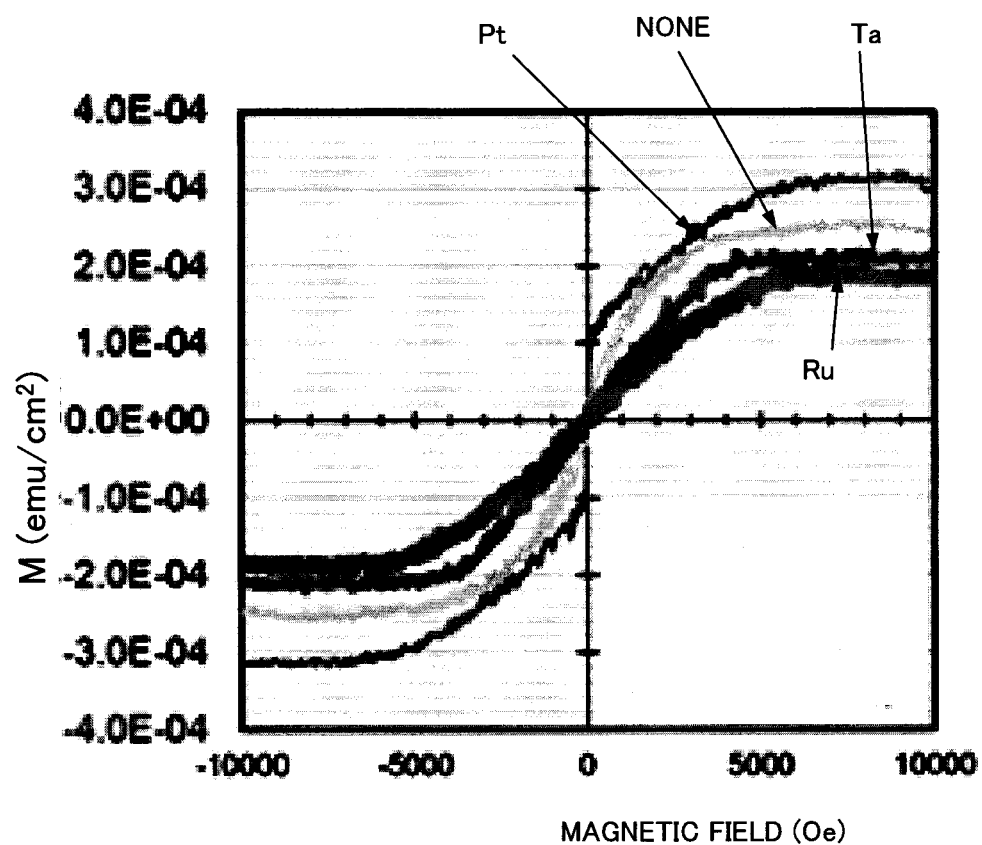
FIG. 16 is a view illustrating a relationship between the strength of an applied magnetic field and the magnitude of the magnetization of a recording layer in a case in which the second protective layer of the MTJ element illustrated in FIG. 12 is formed of a different material, and the magnetic field is applied from the outside perpendicularly to layer surfaces.
Figure 17:
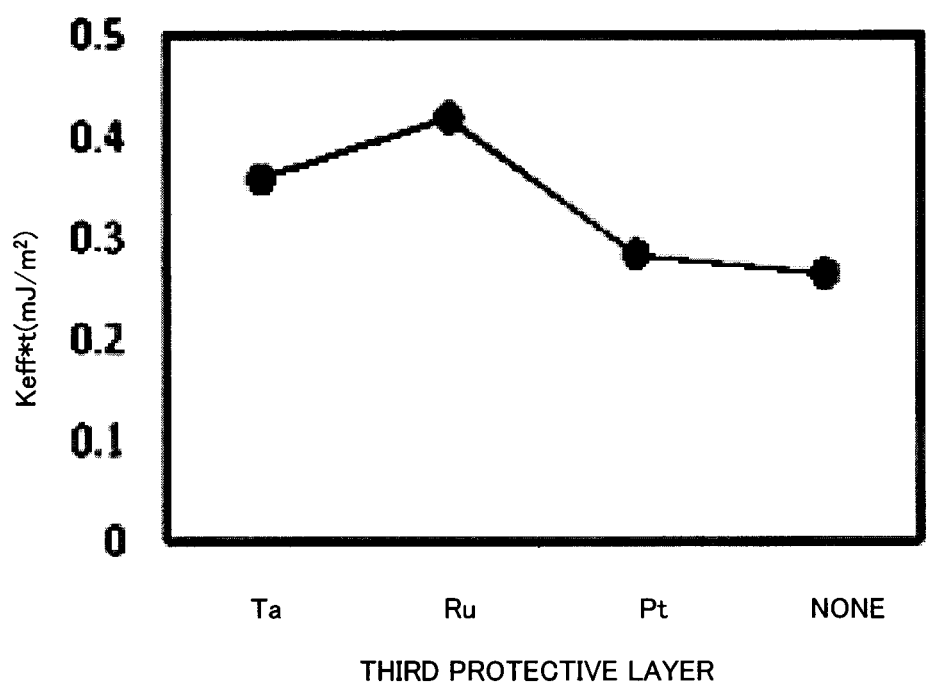
FIG. 17 is a view illustrating a relationship between the presence or absence and material of a third protective layer and the product (Kefft) of the magnetic anisotropy and film thickness of a recording layer in a case in which the third protective layer in the MTJ element illustrated in FIG. 12 is formed of a different material.

As an example, the characteristics of each MTJ element 10a in which the material of the third protective layer 181 is Ru, Ti, or Pt or the third protective layer 181 is not disposed are illustrated in FIG. 16 and FIG. 17.

FIG. 16 illustrates the magnitude M [emu/cm$^2$] of the magnetization of the recording layer 16 in the case of applying an external magnetic field in a range of −10,000 [Oe] to +10,000 [Oe] to each MTJ element 10a in a direction perpendicular to each layer.

As illustrated in the figure, the magnitude M of the magnetization is increased in the order of the MTJ element 10a in which the third protective layer 181 is formed of Ru, the MTJ element 10a in which the third protective layer 181 is formed of Ta, the MTJ element in which the third protective layer 181 is not disposed, and the MTJ element 10a in which the third protective layer 181 is formed of Pt.

In the MTJ element 10a in which the third protective layer 181 is formed of Pt, the magnitude M of the magnetization changes is sharply varied in the vicinity of a magnetic field of zero. This shows that CoFeB included in the second protective layer 18 has in-plane magnetization.

As illustrated in FIG. 17, a high value of a perpendicular magnetic anisotropy Keff·t [mJ/m$^2$] is obtained in a case in which the third protective layer 181 is formed of Ru or Ta. In contrast, in a case in which the third protective layer 181 is formed of Pt, a perpendicular magnetic anisotropy Keff·t is slightly higher than in a case in which the third protective layer 181 is not arranged. This is because Pt has the low effect of reducing the magnetization even if being diffused into the second protective film 18 and the magnetization of the second protective film 18 adversely affects the perpendicular magnetization anisotropy of the recording layer 16. In such a case, however, the second protective layer 18 formed of CoFeB has magnetization, and the in-plane magnetization of the recording layer 17 is high as illustrated in FIG. 16. Keff denotes an effective magnetic anisotropy energy density, and t denotes the thickness of the recording layer 16.

Embodiment 3

When a second protective layer 18 is a magnetic layer and has a magnetization-easy axis in an in-plane direction, a high in-plane magnetic field is applied to a recording layer 16 having perpendicular magnetizability by a magnetostatic interaction. The applied in-plane magnetic field results in the deterioration of the thermal stability factor Δ of recording layer 16 and the deterioration of the performance of an MTJ element.

Figure 18:
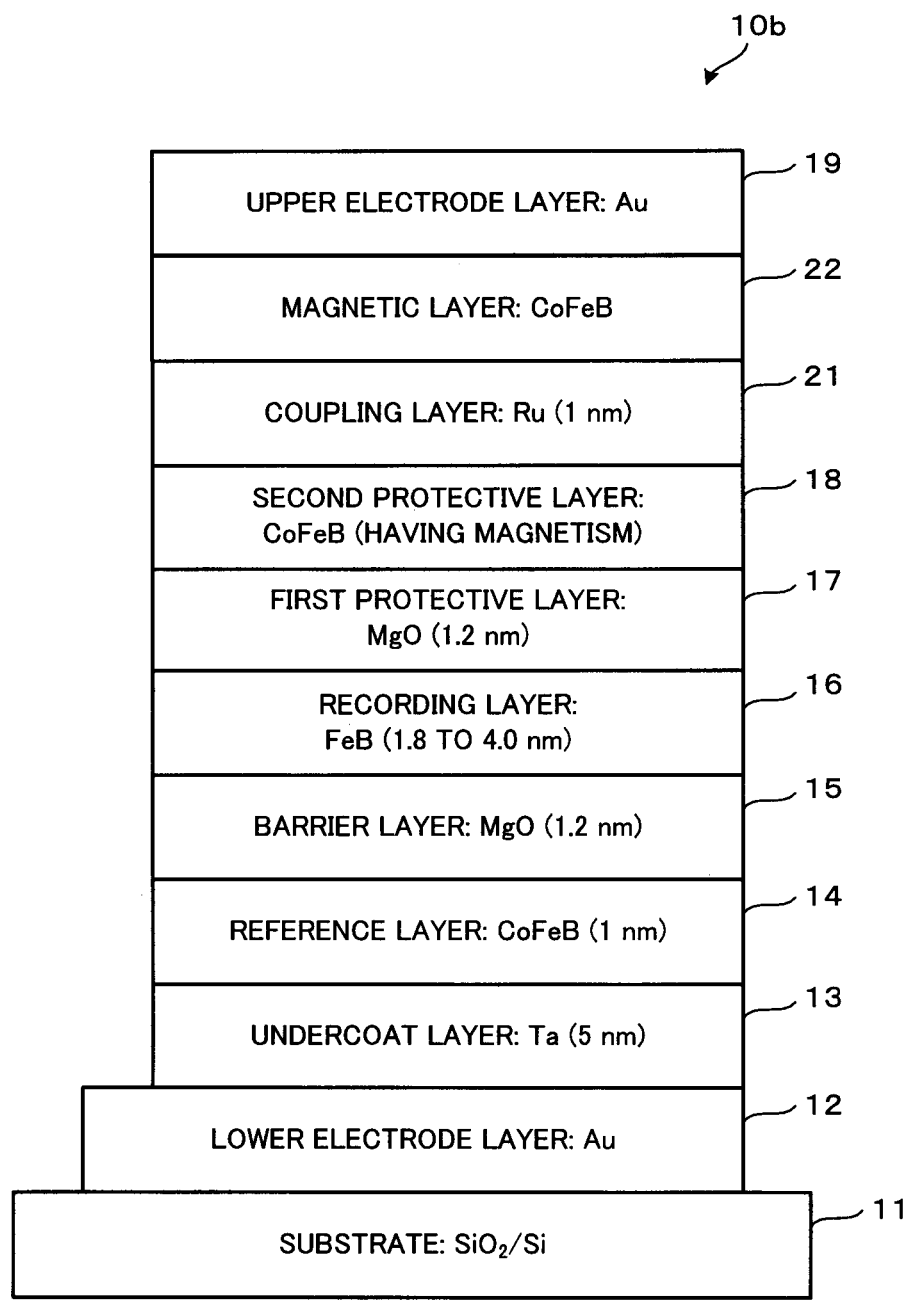
FIG. 18 is a view illustrating the structure of an MTJ element according to Embodiment 3 of the present disclosure.

An MTJ element 10b including the second protective layer 18 including a magnetic layer such as a CoFeB layer, a coupling layer 21 which is formed on the second protective layer 18 and includes a non-magnetic layer, and a ferromagnetic layer 22 which is formed on the coupling layer 21 and in which the direction of in-plane magnetization is opposite to that in the second protective layer 18 as illustrated in FIG. 18 may be used in order to reduce such an in-plane magnetic field.

In such a case, the second protective layer 18 has a thickness of, for example, 1.5 to 3.5 nm.

A material that generates a high interlayer coupling magnetic field, such as Ru, Cr, or Ir, is preferable for the coupling layer 21. However, antiferromagnetic coupling occurs between two ferromagnetic layers having in-plane magnetization-easy axes due to a magnetostatic interaction. Therefore, use of any material which is a non-magnetic material allows a similar effect to be obtained. Similarly, in the case of a reference layer 14, the recording layer 16, or the like, the ferromagnetic layer 22 can use an optional material such as Co, Fe, CoB, FeB, or CoFeB.

It is desirable to adjust the film thickness of the coupling layer 21 as appropriate so that antiferromagnetic interlayer coupling is allowed to occur between the second protective layer 18 and the ferromagnetic layer 22. It is necessary that the ferromagnetic layer 22 has a film thickness that is more than the film thickness of the second protective film 18 when using a material of which the magnetization is equal to or less than the magnetization of the CoFeB layer included in the second protective film 18. In contrast, when a material of which the magnetization is more than the magnetization of the second protective layer 18 is used, the film thickness is adjusted as appropriate so that a leaked magnetic field in an in-plane direction is minimized.

When the second protective layer 18 is a magnetic layer and has a magnetization-easy axis in a direction perpendicular to a plane, the action of the MTJ element 10 is instable in a state in which the direction of the magnetization of the recording layer 16 is opposite to the direction of the magnetization of the second protective layer 18 and is stable in a state in which the directions are the same. Therefore, asymmetry between an information retention time and a magnetization inversion current becomes great.

In order to solve such a problem, it is effective to layer the coupling layer 21 including a non-magnetic layer on the second protective layer 18 and to further layering the ferromagnetic layer 22 having perpendicular magnetization of which the direction is opposite to the direction of the magnetization of the second protective layer 18 on the coupling layer 21, similarly in the case of using the in-plane magnetization described above. Unlike the in-plane magnetization, however, ferromagnetic coupling becomes stable due to a magnetostatic interaction in the case of the perpendicular magnetization. The ferromagnetic coupling is increased with decreasing the size of the MTJ element 10b. Accordingly, unlike the use of the in-plane magnetization, the coupling layer 21 is desirable formed of Ru, Cr, Ir, and a material including Ru, Cr, and Ir which allow great antiferromagnetic coupling to occur between the second protective layer 18 and the ferromagnetic layer 22 on the second protective layer 18. The film thickness of the coupling layer 21 is adjusted as appropriate so that the antiferromagnetic coupling between the second protective layer 18 and the ferromagnetic layer 22 is great.

A material such as Co, a CoPt alloy, a CoPd alloy, an FePt alloy, an FePd alloy, CoFeB, or FeB is used as a material having the perpendicular magnetization. A ferrimagnetic material such as TbFeCo is also a candidate for the material.

The coupling layer 21 and the ferromagnetic layer 22 may be arranged regardless of the film thickness of the second protective layer 18 and regardless of whether the second protective layer 18 is a magnetic layer or a non-magnetic layer.

U.S. Patent Application Publication No. 2016/0155931 A1 and International Publication No. WO 2016/089535 A1, published after the priority date (Nov. 18, 2015) of the present disclosure, disclose an MTJ element including a MgO layer 108 and a CoFeB layer 110. However, paragraph 0027 and the like in the literature describe that it is necessary that the CoFeB layer 110 has a thickness of 0.5 nm or less in order to allow the CoFeB layer 110 to be a non-magnetic film, and the CoFeB layer 110 is allowed to have a thickness of 1 nm to 3 nm in order to provide magnetic moment. In other words, according to the literature, the CoFeB layer is a magnetic film when having a thickness of more than 0.5 nm. In Embodiment 2 of the present application, the third protective layer 181 including Ru or the like is arranged on the second protective layer 18 including CoFeB or the like. As a result, the second protective layer 18 is a non-magnetic film even when being 0.6 to 1.0 nm and does not affect the perpendicular magnetic anisotropy of the MTJ element 10a even when being 1.5 nm. Accordingly, the present disclosure is entirely different from the technology of the above-described literature. In Embodiment 3 of the present application, when the second protective layer 18 is an in-plane magnetic layer, the non-magnetic layer 21 and the ferromagnetic layer 22 are layered on the second protective layer 18, and the direction of the magnetization of the second protective layer 18 and the direction of the magnetization of the ferromagnetic layer 22 are allowed to be opposite to each other. As a result, the influence of the magnetization of the second protective layer 18 on the perpendicular magnetic anisotropies of the reference layer 14 and the recording layer 16 is reduced. The above-described literature do not disclose such a technology at all. Accordingly, the present disclosure is entirely different from the technology of the above-described literature.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2015-225994, filed on Nov. 18, 2015, the entire disclosure of which is incorporated by reference herein.

REFERENCE SIGNS LIST 10, 10a, 10b Magnetic tunnel junction element (MTJ element)
11 Substrate
12 Lower electrode layer
13 Undercoat layer
14, 14A, 14B Reference layer (fixed layer)
15, 15A Barrier layer (insulating layer)
15B, 17B Non-magnetic coupling layer
16, 16A, 16B Recording layer (free layer)
17, 17A First protective layer (insulating layer)
18 Second protective layer (cap layer)
19 Upper electrode layer
20 Selection transistor
21 Non-magnetic layer
22 Ferromagnetic layer
100 Magnetic memory circuit
101 X driver
102 Y driver
103 Sense amplifier
104 Source line driver
WL Word line
BL Bit line
SL Source line

The invention claimed is:

1. A magnetic tunnel junction element, comprising:
a reference layer that comprises a ferromagnetic material;
a barrier layer that comprises oxygen;
a recording layer that comprises a ferromagnetic material comprising Co or Fe;
a first protective layer that comprises oxygen and has a thickness equal to or less than 5.0 nm;
a second protective layer being non-magnetic, comprising at least one of Co, Fe, CoB, FeB, or CoFeB and having a thickness from over 1.0 nm to less than 1.5 nm, and
a third protective layer, formed on the second protective layer and comprising atoms of Ru, Rh, Pd, Cu, Ir, Au, Hf, W, Zr, Nb, Mo, Ti, V, Cr, or an alloy thereof,
wherein
the second protective layer includes atoms which are same as atoms of the third protective layer and which are diffused from the third protective layer thereby preventing the second protective layer from being a magnetic layer;
the magnetic tunnel junction element is created as a stack of layers disposed in a following order: the reference layer, the barrier layer, the recording layer, the first protective layer and the second protective layer or as a stack of layers disposed in an inverted order.

2. The magnetic tunnel junction element according to claim 1, wherein
the atoms comprise Ru atoms,
the second protective film includes Ru, and
the third protective film comprises Ru.

3. The magnetic tunnel junction element according to claim 1, wherein
a direction of magnetization of the recording layer is perpendicular to an interface between the recording layer and the barrier layer or the first protective layer, with which the recording layer comes into contact, due to a magnetic anisotropy of the interface.

4. The magnetic tunnel junction element according to claim 2, wherein
a direction of magnetization of the recording layer is perpendicular to an interface between the recording layer and the barrier layer or the first protective layer, with which the recording layer comes into contact, due to a magnetic anisotropy of the interface.

5. The magnetic tunnel junction element according to claim 1, wherein
at least one of a junction surface between the reference layer and the barrier layer, a junction surface between the barrier layer and the recording layer, or a junction surface between the recording layer and the first protective layer is a junction surface of which an area is smaller than an area of a circle having a diameter of 30 nm.

6. A magnetic memory, comprising:
a storage cell comprising the magnetic tunnel junction element according to claim 1;
a write circuit that selects the storage cell and writes data into the storage cell; and
a read circuit that selects the storage cell and reads data from the storage cell.

7. A magnetic tunnel junction element, comprising:
a reference layer that comprises a ferromagnetic material;
a barrier layer that comprises oxygen;
a recording layer that comprises a ferromagnetic material comprising Co or Fe;
a first protective layer that comprises oxygen; and
a second protective layer,
wherein
the magnetic tunnel junction element is created as a stack of layers disposed in a following order: the reference layer, the barrier layer, the recording layer, the first protective layer and the second protective layer or as a stack of layers disposed in an inverted order,
a direction of magnetization of the recording layer is perpendicular to an interface between the recording layer and the barrier layer and the first protective layer, with which the recording layer comes into contact, due to a magnetic anisotropy of the interface,
the second protective layer comprises at least one of Co, Fe, CoB, FeB, or CoFeB,
the second protective layer has magnetism, and
the magnetic tunnel junction element further comprises: a non-magnetic layer formed on the second protective layer; and a ferromagnetic layer formed on the non-magnetic layer and magnetized in a direction parallel and opposite to a direction of magnetization of the second protective layer.

8. The magnetic tunnel junction element according to claim 7, wherein
the second protective layer has a thickness of from over 1.5 nm to 3.5 nm.

9. The magnetic tunnel junction element according to claim 8, wherein
a direction of magnetization of the recording layer is perpendicular to an interface between the recording layer and the barrier layer or the first protective layer, with which the recording layer comes into contact, due to a magnetic anisotropy of the interface.

10. The magnetic tunnel junction element according to claim 7, wherein
at least one of a junction surface between the reference layer and the barrier layer, a junction surface between the barrier layer and the recording layer, or a junction surface between the recording layer and the first protective layer is a junction surface of which an area is smaller than an area of a circle having a diameter of 30 nm.

11. A magnetic memory, comprising:
a storage cell comprising the magnetic tunnel junction element according to claim 7;
a write circuit that selects the storage cell and writes data into the storage cell; and
a read circuit that selects the storage cell and reads data from the storage cell.

* * * * *